(12) United States Patent
Beasley et al.

(10) Patent No.: US 8,686,898 B2
(45) Date of Patent: Apr. 1, 2014

(54) SYSTEM EMPLOYING A DIRECT DIGITAL SYNTHESISER

(75) Inventors: Patrick David Lawrence Beasley, Worcester (GB); Robert David Hodges, Tarrington (GB); David George Hodges, Newent (GB)

(73) Assignee: Qinetiq Limited, Farnborough (GB)

( * ) Notice: Subject to any disclaimer, the term of this patent is extended or adjusted under 35 U.S.C. 154(b) by 524 days.

(21) Appl. No.: 13/129,735

(22) PCT Filed: Nov. 19, 2009

(86) PCT No.: PCT/GB2009/002706
§ 371 (c)(1),
(2), (4) Date: May 17, 2011

(87) PCT Pub. No.: WO2010/061170
PCT Pub. Date: Jun. 3, 2010

(65) Prior Publication Data
US 2011/0227784 A1   Sep. 22, 2011

Related U.S. Application Data

(60) Provisional application No. 61/146,076, filed on Jan. 21, 2009.

(30) Foreign Application Priority Data

Nov. 26, 2008 (GB) .................................. 0821613.7

(51) Int. Cl.
*G01S 13/00* (2006.01)
*G01S 13/28* (2006.01)
(52) U.S. Cl.
USPC ............ 342/195; 342/83; 342/128; 342/175; 342/200

(58) Field of Classification Search
CPC ..... G01S 13/34; G01S 13/343; G01S 7/4008; G01S 17/936; G01S 7/35; G01S 13/24; G01S 2007/356; G01S 13/345; G01S 13/282; G01S 13/32; G01S 13/536; G01S 2007/358; H03L 7/0995; H03L 7/148
USPC ............. 342/84, 99, 100, 118, 128–130, 175, 342/192, 195, 200–204
See application file for complete search history.

(56) References Cited

U.S. PATENT DOCUMENTS 5,053,772 A * 10/1991 Lamper et al. ............... 342/25 A
5,055,850 A * 10/1991 Lamper et al. ................ 342/201
(Continued)

FOREIGN PATENT DOCUMENTS

WO   WO 2008/093077 A2   8/2008

OTHER PUBLICATIONS

British Search Report in British Application No. GB0821613.7; dated Mar. 24, 2009.
(Continued)

*Primary Examiner* — Peter Bythrow
(74) *Attorney, Agent, or Firm* — Oliff PLC

(57) ABSTRACT

A DDS based system, such as a radar, includes means for generating a plurality of transmission signals using a DDS, and means for integrating signals derived therefrom, such as received signals. The system further includes means for varying the relative starting phase of the plurality of transmission signals, or adjusting the DDS input clock while maintaining similar primary output frequency characteristics of the transmission signals. The approach has the effect of changing the location of unwanted frequency spurs in each of the transmission signals, and hence the effects of these are decreased in the integration process. An improvement in the sensitivity of the system results. Although primarily suited to radar applications the invention may find utility in other systems such as sonar or lidar systems.

16 Claims, 5 Drawing Sheets

(56) References Cited

U.S. PATENT DOCUMENTS

| | | | | |
|---|---|---|---|---|
| 5,151,661 | A * | 9/1992 | Caldwell et al. | 327/107 |
| 5,374,903 | A * | 12/1994 | Blanton | 331/4 |
| 5,598,440 | A * | 1/1997 | Domagala | 375/329 |
| 5,770,977 | A * | 6/1998 | Uurtamo | 331/40 |
| 6,449,317 | B1 * | 9/2002 | Critchlow et al. | 375/308 |
| 6,693,580 | B1 * | 2/2004 | Wehling | 342/45 |
| 7,002,511 | B1 * | 2/2006 | Ammar et al. | 342/134 |
| 8,188,911 | B2 * | 5/2012 | Beasley | 342/200 |
| 2002/0094053 | A1 * | 7/2002 | Blazo | 375/376 |
| 2004/0130482 | A1 * | 7/2004 | Lin et al. | 342/82 |
| 2005/0190104 | A1 * | 9/2005 | Coleman et al. | 342/368 |
| 2005/0248374 | A1 * | 11/2005 | Kushnick | 327/105 |
| 2006/0044182 | A1 * | 3/2006 | Vacanti | 342/120 |
| 2006/0049981 | A1 * | 3/2006 | Merkel et al. | 342/195 |
| 2007/0040615 | A1 * | 2/2007 | Ammar | 331/2 |
| 2007/0067123 | A1 * | 3/2007 | Jungerman | 702/67 |
| 2008/0018526 | A1 * | 1/2008 | Wade | 342/204 |

OTHER PUBLICATIONS

International Search Report in International Application No. PCT/GB2009/002706; dated May 7, 2010.

Written Opinion of the International Searching Authority in International Application No. PCT/GB2009/002706; dated May 7, 2010.

\* cited by examiner

SYSTEM EMPLOYING A DIRECT DIGITAL SYNTHESISER

This invention relates to systems that use a Direct Digital Synthesiser (DDS) for signal generation or processing. In particular, it relates to systems that coherently process signals produced by a DDS, and which integrate a plurality of such signals. Such a system may comprise a radar system, typically a CW radar or modulated CW radar.

In a radar system, noise can appear from several different sources. For example, thermal noise is produced by materials due to the random movement of atoms and so has a noise power directly proportional to temperature. Other sources of noise are produced in the radar system's electronics. Some of these may also be random in nature and will typically have a Gaussian distribution, while others may be due to, for example, unwanted or spurious outputs from components or subsystems in the radar, and may not be random in nature.

Many types of radar system are designed to take a plurality of measurements from a region, and to process the plurality of measurements together in some way. This often comprises an integration stage, where signal returns received from the region are summed together, generally to improve signal to noise ratios and hence detection capabilities. This summation is generally done coherently, i.e. where both the phase and amplitude of the signal returns are taken into account. Coherent integration is beneficial in that it gives an improved ability to reduce the effects of some types of noise. Noise of a more random nature will tend to cancel when integrated over a long enough period, due to the vectorial nature of the summation coupled with essentially a random phase present on each of the returns. Signals e.g. from a target on the other hand will tend to remain after an integration, as the signal returns all tend to be in phase. Noise of a non-random nature will often tend to remain following the integration for the same reasons.

Systems such as Frequency Modulated Continuous Wave (FMCW) radars will typically be arranged to transmit a series of signals into a region and to receive reflections of the signals from targets (be they desired targets or clutter). The signals will typically be linear frequency sweeps each having identical properties in terms of their start and stop frequencies. The radar will integrate the received signals to improve the signal to noise ratio as discussed above. The number of signals to be integrated will depend on system parameters such as the time taken to produce a single frequency sweep, and (for a rotating or electronically scanned radar) the dwell time on the target region. Typically a system may integrate between 16 and 1024 signals in its processing, and the time interval over which those signals are generated and processed is termed the integration time.

Radar systems are increasingly using signal generation techniques that incorporate DDS devices, due to their inherent flexibility and precise control of their output parameters. DDS devices allow complex modulation signals to be generated simply and repeatably. The outputs of such devices typically comprise a wanted signal (termed herein the primary output), but will also comprise other signals, these being artifacts of the operation of the DDS. The artifacts comprise unwanted signals at amplitudes generally many orders of magnitude (typically −60 dBc to −80 dBc) below the desired signal, and which appear at determinate frequencies, some of which may be harmonically related to the primary output whereas others may not. These are generally known as spurs. As they are typically so small in relation to the wanted signal, they often do not pose any problems. For some applications however, the spurs can have a significant detrimental effect on system performance. One such application is in CW radar, where DDS devices can be used to modulate a local oscillator (LO) to generate a signal to be transmitted. In such systems the spurs present on the DDS output will also modulate the LO, which has the effect of increasing the apparent noise floor of radar, which may mean that smaller targets are much more difficult to detect.

According to a first aspect of the present invention there is provided a system employing a direct digital synthesiser (DDS), the system being adapted to use the DDS to provide a modulated signal for transmission, the modulated signal comprising at least a first followed temporally by one or more subsequent signals generated over an integration period, the first and subsequent signals having similar primary frequency characteristics, each signal having an associated starting phase, the system further incorporating an integrator for integrating signals derived from the first and subsequent modulated signals;

the derived signals being comprised of intermediate frequency (IF) signals produced by mixing each signal with a delayed version of itself;

wherein the DDS is provided with at least an input clock source, an input allowing control of the starting phase for each signal, and an input for controlling the DDS output frequency;

characterised in that the DDS is arranged to generate a primary output frequency characteristic, the characteristic being the same for both the first and subsequent signals over the integration period, wherein the DDS is arranged to have at least one of the input clock source frequency and the starting phase changed between production of the first signal and a subsequent signal.

The limitation that the first and subsequent signals have similar primary frequency characteristics means that the wanted frequencies at the output of the DDS and involved in the modulation, including any start and end frequencies, along with any frequency sweep parameters, are the same for both the first and subsequent signals—it is these parameters that define the primary output frequency characteristics. Note that frequency spurs, as described below, along with any noise generated within the DDS, do not count as primary outputs or primary frequency characteristics (as defined herein) of the DDS. Although the invention has utility when only two signals—the first and an immediately following signal—are used, the invention may be used with any suitable number >1 of signals. The first and subsequent signals may comprise any suitable signal, e.g. a frequency swept signal, with the sweep being linear, stepped, or having a more complex non-linear arrangement as appropriate for a particular application. The signals may also comprise phase modulated signals. The only criteria being that the primary outputs of each of the first and subsequent signals generated within an integration period are the same.

The invention provides a means to at least ameliorate some of the stated problems traditionally encountered with DDS devices used in certain environments. By using a system according to the present invention, the spurs created by the DDS will have differing characteristics in each of the first and subsequent signals. If each of the first and subsequent signals is arranged to have a different phase, then the spurs will also in general have different phases, and will, because of the integration process, not accumulate in the same manner as the wanted signals.

An application of an embodiment of the present invention is in the field of FMCW radar systems, where typically the transmitted signals will comprise a sequence of frequency sweeps. Here, a first frequency sweep corresponds to the first signal, and subsequent sweeps correspond to the subsequent signals. These frequency sweeps are generally arranged to be linear sweeps having predefined start and stop frequencies. The start, stop, and sweep characteristics (i.e. sweep duration and frequency characteristics) are known herein as the primary frequency characteristics. Generally the frequency characteristic comprises a linear frequency sweep, although other such frequency characteristics may be used.

The invention makes use of the observation by the inventors that the initial starting phase of the wanted signal is not relevant in terms of the coherent summation process, as it disappears during production of the IF signal, as is shown in more detail later.

The system has benefits over the prior art where at least two signals (i.e. the first and a subsequent signal) are generated by the DDS in the manner described. Preferably the DDS is adapted to produce at least 4, such as at least 8, such as at least 16 such as at least 32, such as at least 64 such as at least 128 such as at least 256 signals within an integration period, each having similar primary output frequency characteristics, and each being derived from a different input clock frequency or having a differing output phase.

For systems such as FMCW radars the number of signals to be integrated in an integration period (which is typically the radar's dwell time or a sub-multiple thereof) will generally be predefined. Advantageously, if the number of signals to be integrated is known, then the number of input clock frequency changes, or the number of output signal phase changes is chosen to be equal to the number of signals to be integrated, or to a sub-multiple thereof.

For those embodiments where the output phase of the primary output signal is changed for each signal in an integration period, the phase change may advantageously be arranged to step through one or more full 360° cycle (i.e., a full rotation of the unit vector) during the integration period. E.g. the phase change per step may be 360°/n, where n is the number of signals to be integrated.

Each phase change applied to the primary output signal may be anything suitable. For example, the phase of the output signal may conveniently be stepped linearly though n 360°/n steps. Alternatively, the output phase may be chosen in a pseudo random manner. Preferably, during each integration period at least 8, such as at least 16, such as at least 32, such as at least 64 different phases are chosen. The advantage of having a greater number of discrete phases is that the spurs are more likely to be smeared out during the integration process, i.e. the phases of the spurs are more likely to take on a full range of values, leading to a better reduction of the effects of the spurs as the signals are integrated. Clearly there cannot be more phases chosen than there are signals in an integration period, but if there are fewer chosen then preferably an integer number of rotations of the unit vector are chosen.

If the input clock frequency to the DDS is changed between production of the first and a subsequent signal then the DDS will in general need to be adapted to take account of this, if it is to produce a primary output signal having similar properties in terms of its output frequency for each of the first and subsequent signals. This will be done according to the properties of the particular DDS device used. The manner in which it will be done will be known to the normally skilled person, as programming the DDS device to produce a particular output frequency given knowledge of the clock input frequency is a commonplace procedure with such devices. The input clock may be generated by any suitable means. Conveniently the input clock may itself be produced by a second DDS, as then the clock frequency can be easily changed with suitable accuracy.

According to a second aspect of the present invention there is provided a method of processing signals in a radar system comprising the steps of:
 a) using a direct digital synthesiser (DDS) to produce a first and a subsequent signal as primary outputs, the first and subsequent signals having similar primary output frequency characteristics;
 b) transmitting the first and subsequent signals, or signals derived therefrom;
 c) receiving a signal, comprising at least a reflection from one or more objects, of the transmitted signal;
 d) mixing the received signal with a portion of the signal being transmitted to produce an intermediate frequency signal (IF);
 e) coherently integrating IF signals, or signals derived therefrom, from the first and subsequent signals;
 characterised in that, in step a), the DDS is programmed to change a phase of the primary output between generation of the first and the subsequent signal.

The phase change amount may be anything convenient. It may be determined randomly or pseudo-randomly, or may comprise linear steps, as described above in relation to a first aspect of the invention.

The first and subsequent signals may comprise a frequency sweep. The frequency sweep may be a linear sweep.

According to a third aspect of the present invention there is provided a method of processing signals in a radar system comprising the steps of:
 a) using a direct digital synthesiser (DDS) to produce a first and a subsequent signal as primary outputs, the first and subsequent signals having similar primary output frequency characteristics;
 b) transmitting the first and subsequent signals, or signals derived therefrom;
 c) receiving a signal, comprising at least a reflection from one or more objects, of the transmitted signal;
 d) mixing the received signal with a portion of the signal being transmitted to produce an intermediate frequency signal (IF);
 e) coherently integrating IF signals produced from the first and subsequent signals;
 characterised in that, in step a), the DDS has a clock input provided by a programmable frequency device, and between the first and the subsequent signal, the programmable frequency device is arranged to change the clock frequency provided to the DDS by a predetermined amount, and wherein the DDS is programmed to compensate for its different frequency input such that that the subsequent signal has similar primary frequency characteristics.

The invention will now be described in more detail, by way of example only, with reference to the following Figures, of which:

Figure 1:
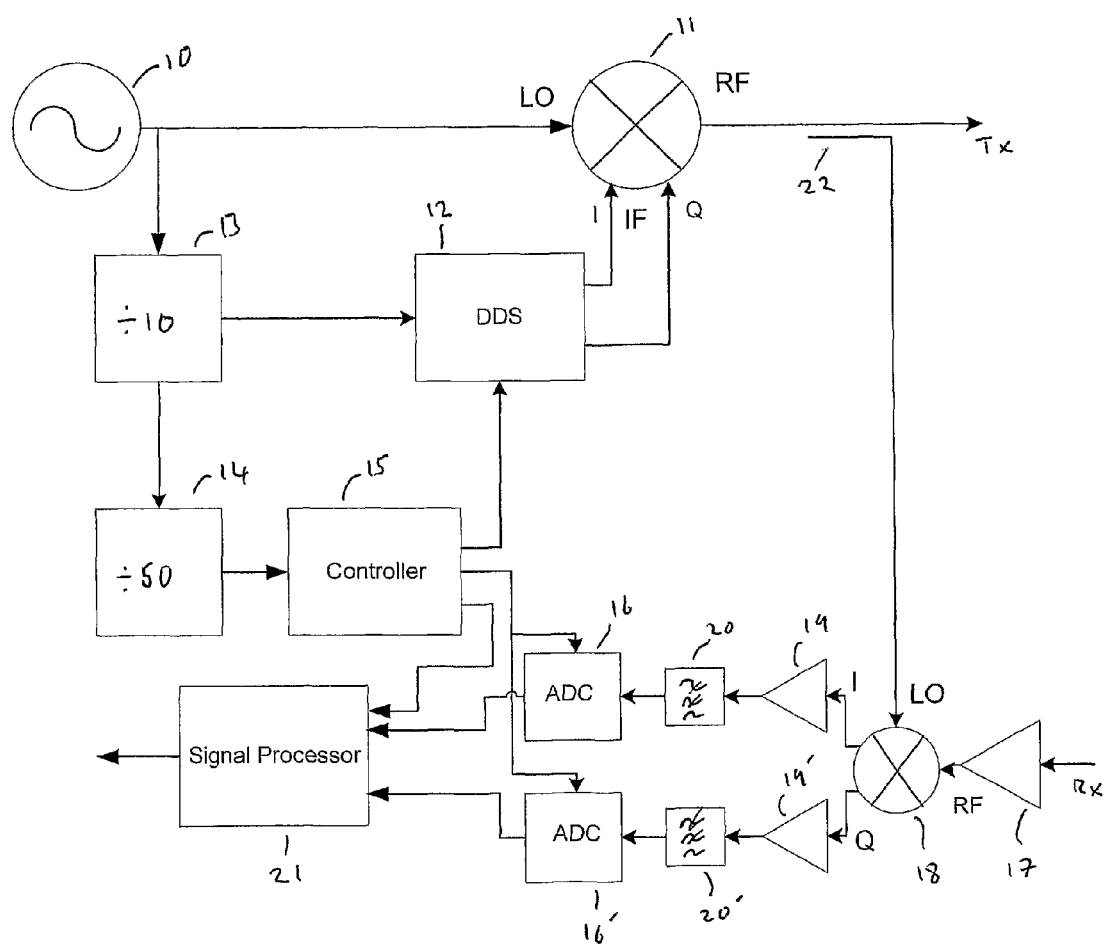
FIG. 1 shows a block diagram of a typical hardware setup—an FMCW radar in this case—in which an embodiment of present invention may be implemented.

FIG. 1 shows an FMCW radar system incorporating a DDS, the DDS being used to provide a modulated output. The system shown is largely similar to that shown in co-pending patent application PCT/GB2008/000306, the whole contents of which are hereby included by reference. The radar incorporates a local oscillator (LO) 10 operative at 9.2 GHz which provides an input to a quadrature up-convert mixer 11. A second input to the mixer 11 comes from an IF oscillator in the form of a direct digital synthesiser (DDS) device 12, in this case implemented using a pair of Analog Devices AD9858 DDS chips. As well as providing an input to mixer 11, the output of the LO 10 also feeds a first frequency divider 13, which in turn drives a second frequency divider 14. An output from the first frequency divider 13 is used as a reference clock source for the direct digital synthesiser 12. The second frequency divider 14 provides a clock reference source to a controller 15, which may be a microcontroller, which has controlling outputs connected to the DDS and to analogue to digital converters (ADC) 16, 16' that are used to digitise incoming signals reflected from targets and other objects. The controller 15 also provides synchronisation data to signal processing means 21.

The radar has a receiver chain comprising a low noise amplifier 17, a mixer 18 having both In phase (I) and Quadrature (Q) outputs coupled to a pair of IF amplifiers 19, 19', then to a pair of Nyquist filters 20, 20', defining a pair of channels. The outputs of the Nyquist filters 20, 20' feed ADCs 16, 16' each of which provides digital signals to signal processing means 21. Mixer 18 has a second input taken from the signal to be transmitted.

Transmit mixer 11 is a quadrature up-convert mixer fed at the IF input with both an I and Q input from DDS 12.

In operation, the LO 10 produces a 9.2 GHz LO output which feeds one input of mixer 11. The DDS is clocked by a reference clock signal derived from the LO output, but divided in frequency from it by a quotient of 10. The output frequency of the DDS 12 is determined by this clock in combination with the input from the controller 15. The clock input to the controller is taken from the frequency divider 14 having a division quotient of 50, which is itself supplied from frequency divider 13. Thus the clock frequency supplying the ADCs is 18 MHz. The controller 15 contains logic that triggers the DDS 12 to start its frequency sweep, causing the DDS 12 output to ramp linearly between 200 MHz and 250 MHz in a repetitive fashion. This output frequency is mixed with an output of the STALO 10 in mixer 11, to produce the output signal of the radar, of 9.4 GHz to 9.45 GHz. As both the DDS 12 and the controller 15 are locked, via dividers 13 and 14, to the STALO 10, the output signals of the controller 15 and the DDS 12 are all coherent with the STALO 10 output. The controller 15 may also be used to reprogram the DDS 12 to change its frequency sweep parameters should such frequency agility be desired. For example, subsequent integration periods may use signals having differing primary frequency characteristics The controller 15 is also adapted to communicate with the DDS 12 so as to be capable of changing the starting phase at the output of the DDS 12 for each sweep.

Received signals comprising, amongst other things, reflections from targets enter the system via a receive antenna (not shown), and are amplified in low noise amplifier 17. The amplified signal is then mixed with a signal simultaneously being transmitted by the transmitter, by splitting off some of the energy in the final stages of the transmit path, using directional coupler 22. Thus in this fashion an IF signal is produced that comprises a signal mixed with a delayed version of itself, the delay being created by transmission and subsequent reception of signals reflected from targets within a region.

The output of mixer 18 is an I-Q pair comprising the difference frequency between the received signal and the signal simultaneously being transmitted. The signals are amplified in amplifiers 19, 19', filtered in low pass filters 20, 20' before being digitised using analogue to digital converters 16, 16'. The digitisers are driven by a clock signal from the controller 15, which as described above is itself driven from a clock derived from the STALO 10.

The resulting signals are then processed in processor 21 by calculation of a discrete Fourier transform (which may be calculated using the Fast Fourier Transform (FFT) algorithm) of each digitised signal, and coherently integrating the output of the Fourier transformed signals received within an integration period to boost signal to noise levels. The integration period may be chosen dependent upon the application of the radar, and upon other parameters such as dwell time, signal sweep time etc. The integration period may be arranged to vary depending upon the particular target type being detected. An embodiment of the present invention designed for detection of small objects is adapted to produce 16 signals, each comprising a frequency sweep having identical primary frequency characteristics, within an integration period.

By suitable control of the DDS 12 the arrangement of FIG. 1 may be used to implement an FMCW radar of the prior art, or may be adapted to implement an embodiment of the present invention. When adapted to implement an embodiment of the present invention the controller 15 is adapted to reprogram the DDS so that for each of the first and subsequent signals generated within an integration period the starting phase of the signal differs as described herein.

Figure 2:
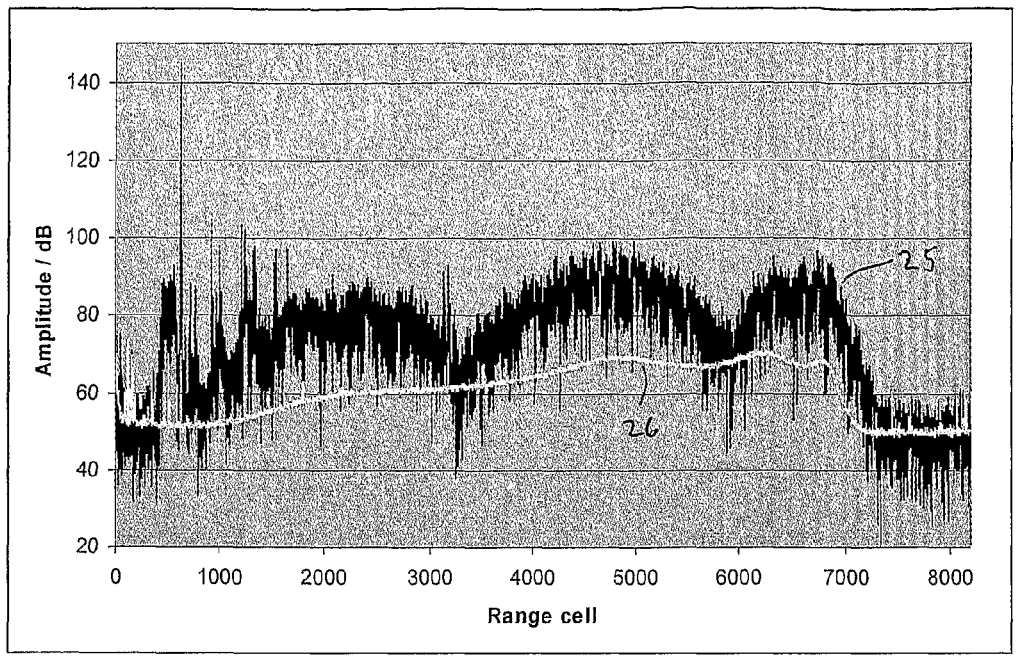
FIG. 2 shows a graph of an output from a test-bed radar system that uses a DDS in the generation of its transmitted signal, the graph showing a processed return from a single transmitted signal.

FIG. 2 shows a graph of a single sweep from the radar system as shown in FIG. 1. As only a single sweep is shown, it is not apparent from the graph whether the radar is set up as an embodiment of the present invention (e.g. adapted to provide differing phases for differing sweeps), or whether the radar is adapted to maintain a fixed starting phase for each sweep as known from the prior art, as no integration has yet taken place. A first trace 25 shows a return of amplitude against range for a single frequency sweep, i.e. with no averaging of any kind applied. It therefore represents information from the output of the radar following an FFT processing step. The sweep was directed at a scene containing a large, 1000 square meter radar cross section (RCS) target located at a range of around 250 m, which corresponded to range cell 617. The large amplitude return from this can be clearly seen. Other, smaller, targets can be seen at longer ranges. However, the noise levels in the trace 25 are relatively high. These high noise levels are produced by phase noise in the system, a significant amount of which is produced by spurs on the output of the DDS. These spurs may typically be at levels of −60 dB compared to the primary output. At these low levels it has been generally understood by the normally skilled person that their contribution to the total system phase noise is minor. It has been found however that this is not the case. When large, static objects are present in the region, such as the 1000 square meter RCS target shown in FIG. 2, the system phase noise produces the degraded noise floor as shown. Over a single trace, the phase noise is therefore seen to produce a significant degradation in the radar performance.

Superimposed on the graph is a second trace 26 showing the thermal noise floor of the radar. Trace 26 therefore gives an indication of the sort of levels that should be attainable for a realistic system noise floor when many returns are averaged. This second trace 26 was produced by covering the receiver antenna to prevent any external signals from entering the radar, and non-coherently integrating the resulting signals, which are due to internal system noise.

Figure 3:
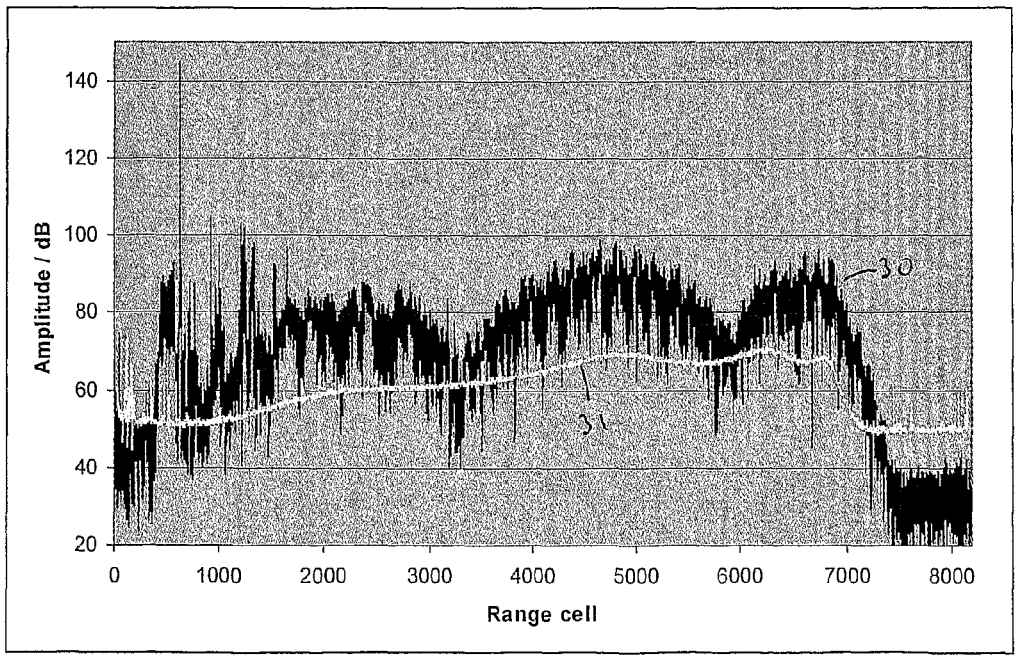
FIG. 3 shows a graph of an averaged series of outputs from the test bed radar where the DDS is arranged to work according to the prior art, and hence is not adapted to implement the present invention.

FIG. 3 shows a graph again showing the output of the test-bed radar. Trace 30 shows the result of averaging 256 consecutive sweep signals, each one having similar frequency characteristics, and each having similar starting phases. It therefore represents a signal generated and processed according to the prior art. Prior to the present invention, one would expect the noise to be reduced, due to the averaging, by 10 log 256 dB if the noise were random in nature, as explained above. However, it can be seen that noise levels remain largely unchanged, indicating that the noise—largely consisting of phase noise—is coherent and so does not decay with averaging.

The second trace 31 is shown for reference and is identical to, trace 26 of FIG. 2.

Figure 4:
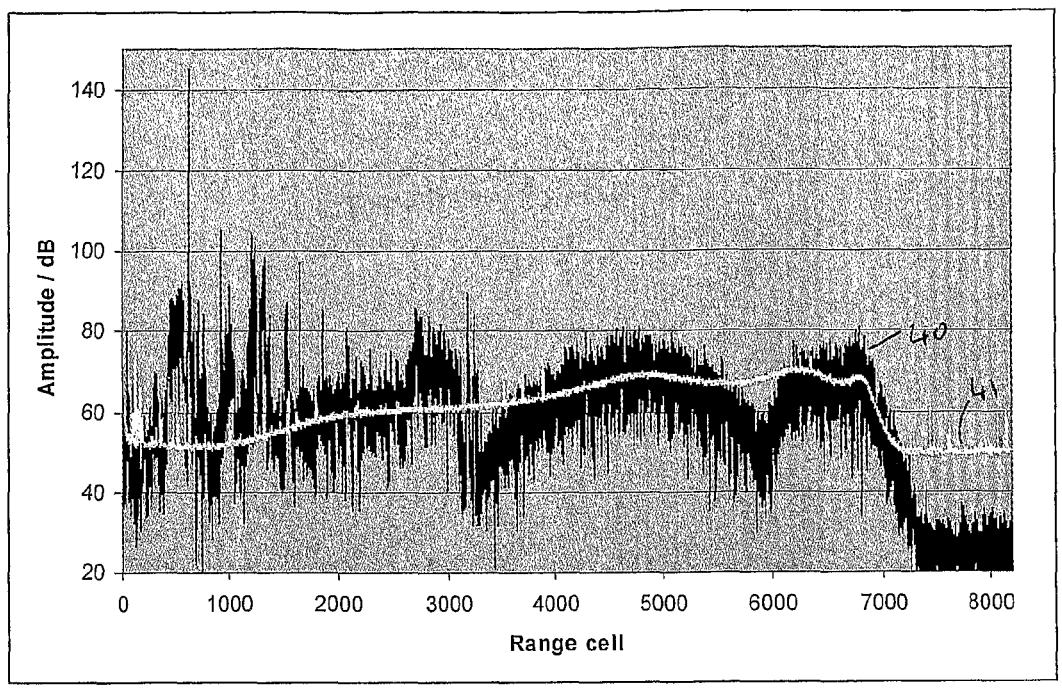
FIG. 4 shows a graph of an averaged series of outputs from the test bed radar where the DDS is adapted to implement the present invention.

FIG. 4 shows a graph again showing the output of the test-bed radar. Trace 40 is an output of the radar again comprising the mean of 256 consecutive sweep signals each having similar frequency characteristics. However, this time the controller was adapted to generate each sweep signal with a different starting phase. The phase increment chosen was 360°/64, or 5.625°. This means that over the 256 consecutive sweeps each phase increment was used four times, and the unit vector of the starting frequency of the primary output (i.e. a notional unit vector having a phase equal to the phase of the starting frequency) has had four complete rotations.

Second trace 41 is identical to trace 26 of FIG. 2, and is reproduced to show comparative improvements of the invention over the prior art.

A significant improvement on the previous graph can be seen, with the noise level being around 20 dB lower, with no change in the level of the target at range cell 617. This is close to the theoretical 24 dB drop that would be observed if the noise were truly Gaussian random noise. Other targets in cells between 1000 and 3500 may also be seen that were previously obscured by noise. The vectorial summation in the integrator has the effect of reducing the noise levels caused by the spurs. As the phases of radar returns from targets following the mixing process is unaffected by the step in phase of the transmitted signals, the integration results in an increase in the level of signals representative of target returns. Note that the trace 40 sometimes dips below the averaged system noise trace 41. It is able to do this because trace 40 is a coherently averaged signal whereas trace 41 is incoherently averaged, as explained above.

An analysis of why changing the starting phase of the primary output of the DDS according to the present invention provides a benefit when implemented in an FMCW radar is now presented.

The phase of a linear frequency ramp waveform transmitted by an FMCW radar can be described by equation 1.

$$\phi = \left(\frac{\pi \Delta F}{T}\right)t^2 + 2\pi f_0 t + \phi_0 \qquad \text{Equation 1}$$

Where;
$\phi$ is the phase of the transmitted signal
$\Delta F$ is the frequency deviation of the frequency sweep
$T$ is the duration of the sweep
$t$ is time
$f_0$ is the start frequency
$\phi_0$ is the start phase of the sweep In the radar receiver the signal currently being transmitted is mixed with the received signal, i.e. effectively with a delayed version of itself. Therefore, given a transmitted signal according to equation 2:

$$s_1 = \cos\left(\left(\frac{\pi \Delta F}{T}\right)t_1^2 + 2\pi f_0 t_1 + \phi_0\right) \qquad \text{Equation 2}$$

The received signal will be according to equation 3 (ignoring amplitude levels);

$$s_2 = \cos\left(\left(\frac{\pi \Delta F}{T}\right)t_2^2 + 2\pi f_0 t_2 + \phi_0\right) \qquad \text{Equation 3}$$

The FMCW radar typically mixes (i.e. multiplies together) the received signal with that signal currently being transmitted.

the resultant component after mixing and low pass filtering is;

$$\cos\left(\frac{\pi \Delta F}{T}\right)(t_1^2 - t_2^2) + 2\pi f_0 (t_1 - t_2) \qquad \text{Equation 4}$$

This shows that the phase of the received IF signal, corresponding to the radar target, is independent of the start phase of the frequency sweep, $\phi_0$. Therefore, as long as the start frequency, $f_0$, of the sweep is maintained, the starting phase can be varied from sweep to sweep without affecting the coherency of the radar.

It is believed that the spurs present on the output of the DDS are predominantly due to the Digital to Analogue (DAC) within the DDS IC, coupled with the limited resolution of the sine wave look up table within the DDS. By changing the start phase of the sweep, the DAC will be exercised through different DAC quantisation levels and the phase of each spur will also change. As the phase of the spurs are different from sweep to sweep, the coherent averaging process leads to a reduction in the effect of the spur on system performance.

Figure 5:
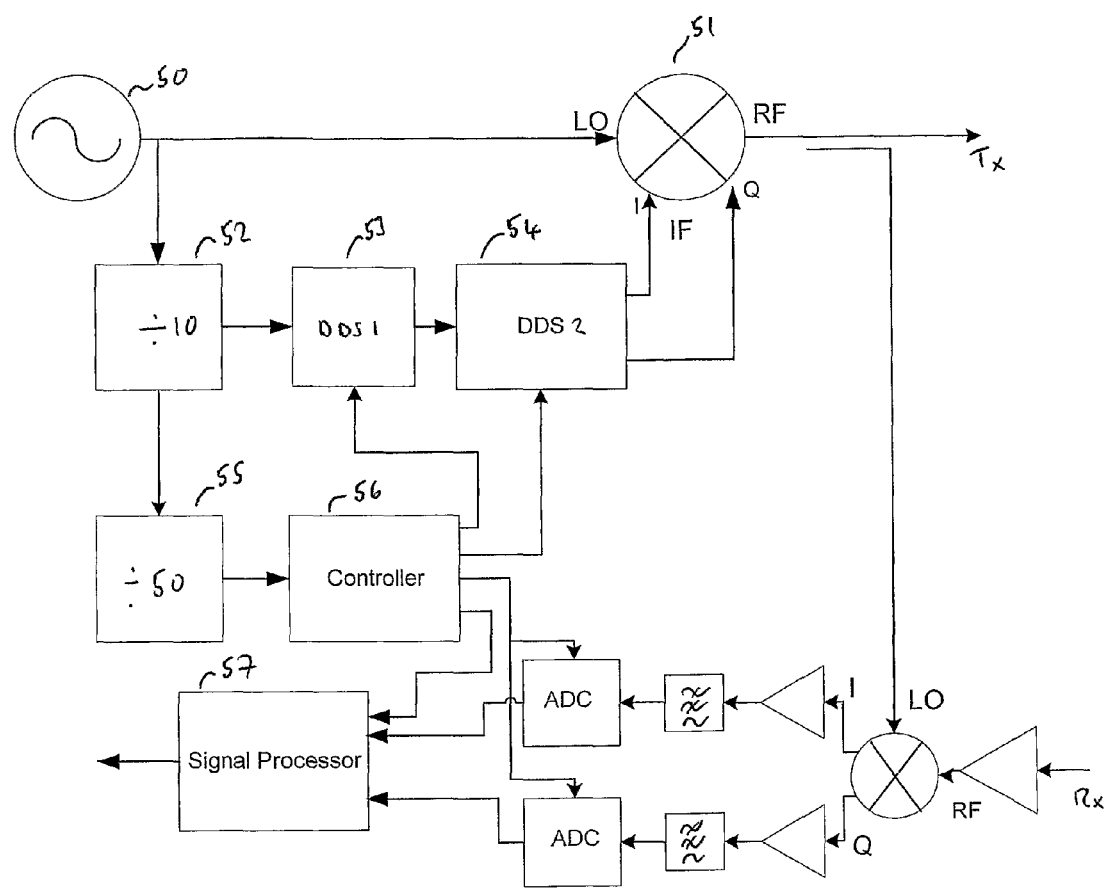
FIG. 5 shows a block diagram of a typical hardware setup upon which a second embodiment of the present invention may be implemented.

FIG. 5 shows a second embodiment of the present invention. As the receive architecture of this embodiment is identical to that described in relation to FIG. 1, it will not be described further. On the transmit side, LO 50 provides an output to quadrature up-convert mixer 51. LO 50 also provides an input to frequency divider 52, which provides an output at $\frac{1}{10}^{th}$ of its input frequency. An output of divider 52 drives a clock input to a first DDS device 53. The first DDS device 53 provides an output to a clock input of a second DDS device 54. The second DDS device 54 produces an I and Q IF signal to quadrature up-convert mixer 51. Frequency divider 52 also feeds a second frequency divider 55 which produces a clock signal for controller 56. Controller 56 provides synchronisation signals for the DDS devices and also for the signal processor in the receive chain. Controller 56 is also arranged to be able to change primary frequency characteristics of both DDS devices.

The purpose of the first DDS is to provide a clock frequency that is accurately controllable within a small range of frequencies. A DDS is therefore ideal for such a task, although in practice any convenient means of generating a variable but predetermined and accurate clock frequency may be used.

In operation, the second DDS 54 is arranged to produce an IF signal comprising a repetitive, linearly frequency swept signal starting at 100 MHz and finishing at 150 MHz. To do this, controller 56 programs the second DDS 54 with, amongst other things, information regarding the input clock frequency. The input clock frequency of the second DDS is around 400 MHz, although as explained below, it is changed at regular intervals. Controller 56 programs the first DDS 53 to provide the expected input clock frequency to the second DDS 54. The repetitive frequency sweeps generated by second DDS 54 comprise a first sweep signal, followed temporally by at least one subsequent sweep signal, each having the same primary output frequency characteristics. However, between the generation of the first and a subsequent signal, the controller 56 is arranged to reprogram the first DDS 53 to provide a slightly different clock frequency as its output. The change may typically be, say, from 400 MHz to 401 MHz. The second DDS 54 is programmed with information regarding its new input frequency, so that it is able to maintain the same primary output frequency characteristics. This may occur for each sweep signal generated within an integration period, although it is not necessary to change the input clock frequency of the second DDS (and hence also reprogram it to provide the same primary output frequency) for every sweep generated within an integration period. As is the case with the embodiment described in relation to FIG. 1, the DDS parameters (input frequency of the second DDS for this embodiment, and output phase of the earlier embodiment) may be changed at least once, and up to n times, where n is the number of signal sweeps provided within an integration period. The greater number of changes that occur however within an integration period, the more the effect of the spurs on the system's apparent noise floor is reduced.

This is because as the parameters within the second DDS 54 change between each of the first and subsequent signals, then the spurs produced by the second DDS will also have different properties. They will tend to appear at different frequencies for each of the first and subsequent signals. The integration of the signals in the receive signal processing system 57 means that contributions due to the spurs will be coherently integrated and so will tend to reduce as compared to the contributions due to the primary output signals.

The input clock change to the second DDS 54 may be anything suitable that has the effect of producing differing spur characteristics at its output. This may vary dependent upon a particular DDS device used.

Figure 6:
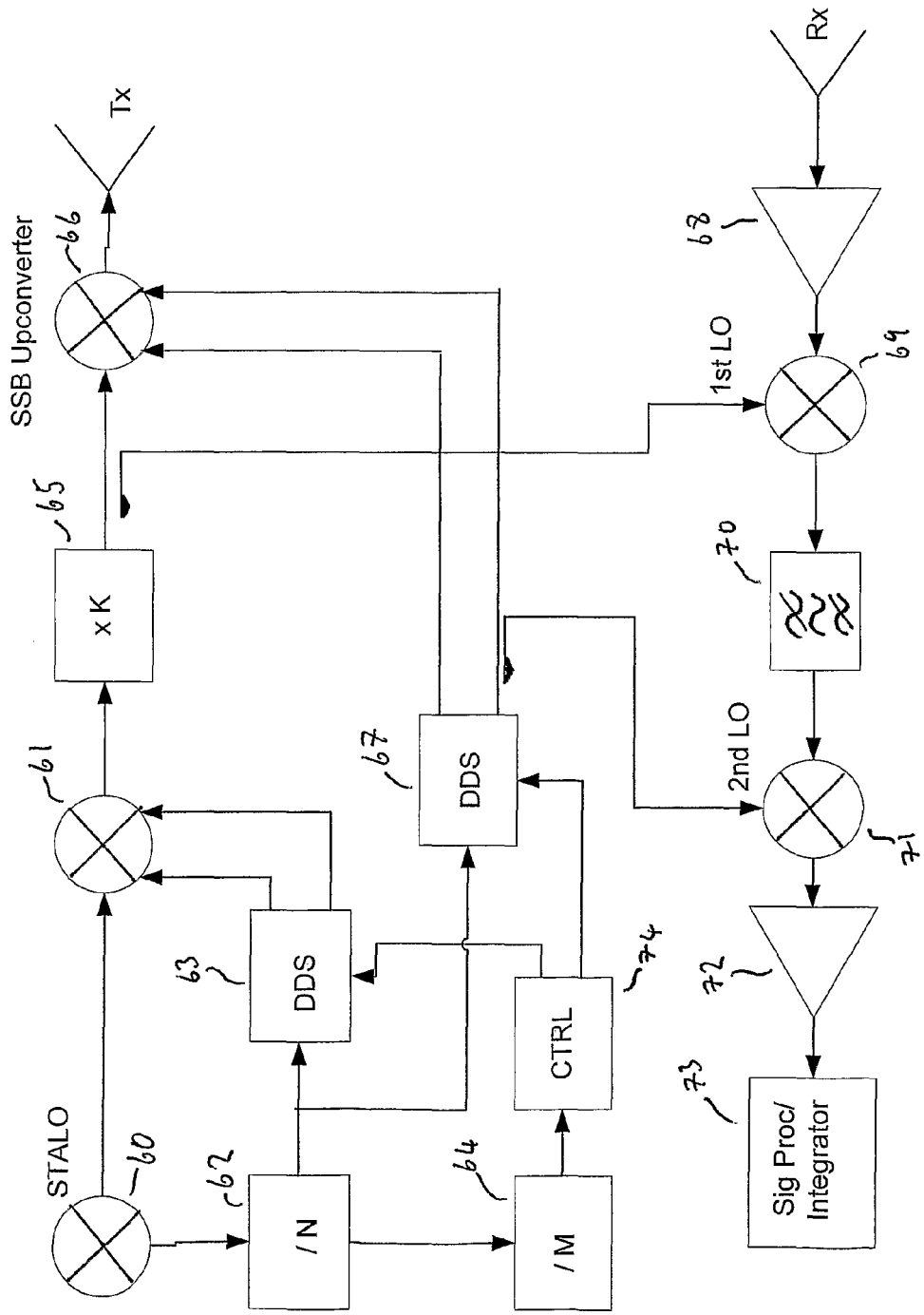
FIG. 6 shows a block diagram of third embodiment of the present invention, wherein the invention is applied to a heterodyne CW radar.

FIG. 6 shows a third embodiment of the present invention. This is a CW radar broadly similar to the embodiment described in FIG. 1, with the exception that it is a heterodyne system. Heterodyne systems are commonplace in radar architectures, due to their often superior noise performance, and convenient filtering requirements. STALO 60, the system frequency reference, generates a stable 7742 MHz output. This output is provided to quadrature up-convert mixer 61 and to frequency divider 62. Divider 62 is a "divide by 8" divider (N=8), and so provides a 967.75 MHz output to the clock input of a first DDS 63 and to a second divider 64. The first DDS 63 has quadrature outputs and is arranged to produce a repetitively a swept frequency signal of between 100 MHz and 150 MHz at its output. The quadrature outputs provide a second input to mixer 61.

The output of mixer 61 is input to a frequency mixer 65 that in this embodiment multiplies the frequency by factor 12. Thus its output is a swept frequency waveform from approximately 94100 MHz to 94700 MHz. This signal is input to a second quadrature up-convert mixer 66. A second DDS 67, that again takes its clock input from the output of divider 62, is arranged to provide quadrature outputs at a fixed 400 MHz output frequency. These outputs are provided as a second input to mixer 66. The output of mixer 66, at around 95.5 GHz to 96.1 GHz, provides the transmit signal for the radar (although additional amplification etc may be provided if necessary). A person having ordinary skill in the art would appreciate that a frequency divider could be used in place of second DDS 67 (with consequent changes to the LO frequency), but that a DDS provides agility to the system for, for example, frequency hopping.

The receiver comprises low noise amplifier 68, the output of which drives an input of $1^{st}$ LO mixer 69. A second input to mixer 69 comes from the output of frequency multiplier 65. The first LO is the difference in frequency between these two, and so is 400 MHz+a target beat frequency, which, as would be understood by someone of ordinary skill in the art, will be dependent upon target range. The $1^{st}$ LO is filtered in band pass filter 70, and then provided to an input of a $2^{nd}$ LO mixer 71. A second input to the $2^{nd}$ LO mixer 71 is taken from the second DDS 67, running at 400 MHz. The output of the $2^{nd}$ LO mixer 71 is thus the target beat frequency. This signal is processed in signal processor 73 in known fashion, by, among other steps, amplification of the output of mixer 71 in amplifier 72 and integration over an integration period of the signals to improve signal to noise, as previously explained. Controller 74 is arranged to adjust the settings of DDS 63 so that, for the signals generated within a single integration period, the starting phase is adjusted a plurality of times, as described above. Thus the integration process will also ameliorate the effects of frequency spurs from the DDS 63, by reducing them relative to the primary output signals from DDS 63.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived there-from. In particular, with reference to the appended claims, features from dependent claims may be combined with those of the independent claims and features from respective independent claims may be combined in any appropriate manner and not merely in the specific combinations enumerated in the claims.

The invention claimed is:

1. A system employing a direct digital synthesiser (DDS), the system being adapted to use the DDS to provide a modulated signal for transmission, the modulated signal comprising at least a first followed temporally by one or more subsequent signals generated over an integration period, the first and subsequent signals having similar primary frequency characteristics, each signal having an associated starting phase, the system further incorporating an integrator for integrating signals derived from the first and subsequent modulated signals;

the derived signals being comprised of intermediate frequency (IF) signals produced by mixing each signal with a delayed version of itself;

wherein the DDS is provided with at least an input clock source, an input allowing control of the starting phase for each signal, and an input for controlling the DDS output frequency;

wherein the DDS is arranged to generate a primary output frequency characteristic, the characteristic being the same for both the first and subsequent signals over the integration period, wherein the DDS is arranged to have at least one of the input clock source frequency and the starting phase changed between production of the first signal and a subsequent signal.

2. A system as claimed in claim 1 wherein the DDS is arranged to generate at least 4 different phases over an integration period.

3. A system as claimed in claim 2 wherein the phases are chosen such that, during an integration period, a unit phasor makes a whole number of rotations around a unit circle.

4. A system as claimed in claim 2 wherein the phases are changed in a linear manner.

5. A system as claimed in claim 2 wherein the phases are changed in a pseudo-random manner.

6. A system as claimed in claim 1 wherein the first and subsequent signals comprise linear frequency sweeps.

7. A system as claimed in claim 1 wherein the input clock source for the DDS is itself provided by a second DDS.

8. A system as claimed in claim 1 wherein at least 4 signals are generated in a single integration period, wherein the number of signals is at least equal to the number of phases.

9. A system as claimed in claim 1 wherein the mixing of each signal with a delayed version of itself occurs in a receiver, with the delay being produced by signal flight time from a transmit antenna, reflection from a target, and subsequent reception at the receiver.

10. A radar incorporating a system as claimed in claim 1.

11. A radar as claimed in claim 10 wherein the radar is a frequency modulated continuous wave radar.

12. A method of processing signals in a radar system comprising the steps of:
    a) using a direct digital synthesiser (DDS) to produce a first and a subsequent signal as primary outputs, the first and subsequent signals having similar primary output frequency characteristics;
    b) transmitting the first and subsequent signals, or signals derived therefrom;
    c) receiving a signal, comprising at least a reflection from one or more objects, of the transmitted signal;
    d) mixing the received signal with a portion of the signal being transmitted to produce an intermediate frequency signal (IF);
    e) coherently integrating IF signals produced from the first and subsequent signals;
    wherein, in step a), the DDS is programmed to change a phase of the primary output between generation of the first and the subsequent signal.

13. A method as claimed in claim 12 wherein step e) is adapted to coherently integrate at least 4 signals, the total transmission time of the integrated signals defining an integration period.

14. A method as claimed in claim 13 wherein, during the integration period, the DDS changes the phase of its primary output n, or a sub-multiple of n times, where n is the number of signals within an integration period.

15. A method as claimed in claim 12 wherein each signal comprises a linear frequency sweep.

16. A method of processing signals in a radar system comprising the steps of:
    a) using a direct digital synthesiser (DDS) to produce a first and a subsequent signal as primary outputs, the first and subsequent signals having similar primary output frequency characteristics;
    b) transmitting the first and subsequent signals, or signals derived therefrom;
    c) receiving a signal, comprising at least a reflection from one or more objects, of the transmitted signal;
    d) mixing the received signal with a portion of the signal being transmitted to produce an intermediate frequency signal (IF);
    e) coherently integrating IF signals produced from the first and subsequent signals;
    wherein, in step a), the DDS has a clock input provided by a programmable frequency device, and between the first and the subsequent signal, the programmable frequency device is arranged to change the clock frequency provided to the DDS by a predetermined amount, and wherein the DDS is programmed to compensate for its different frequency input such that that the subsequent signal has similar primary frequency characteristics.

* * * * *